United States Patent
Wang et al.

(10) Patent No.: US 11,862,283 B2
(45) Date of Patent: Jan. 2, 2024

(54) SENSE AMPLIFIER, STORAGE DEVICE AND READ-WRITE METHOD

(71) Applicant: CHANGXIN MEMORY TECHNOLOGIES, INC., Anhui (CN)

(72) Inventors: Ying Wang, Shanghai (CN); Sunsoo Chi, Shanghai (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 313 days.

(21) Appl. No.: 17/445,607

(22) Filed: Aug. 22, 2021

(65) Prior Publication Data

US 2021/0407558 A1 Dec. 30, 2021

Related U.S. Application Data

(63) Continuation of application No. PCT/CN2021/079898, filed on Mar. 10, 2021.

(30) Foreign Application Priority Data

Jun. 30, 2020 (CN) .......................... 202010615819.4

(51) Int. Cl.
*G11C 7/08* (2006.01)
*G11C 7/14* (2006.01)
*G11C 7/06* (2006.01)
*G11C 7/12* (2006.01)
*G11C 11/4091* (2006.01)

(52) U.S. Cl.
CPC ................ *G11C 7/065* (2013.01); *G11C 7/12* (2013.01); *G11C 11/4091* (2013.01)

(58) Field of Classification Search
CPC ....... G11C 7/065; G11C 7/12; G11C 11/4091; G11C 7/06; G11C 5/025; G11C 7/14;
(Continued)

(56) References Cited

U.S. PATENT DOCUMENTS

| 7,215,595 B2 | 5/2007 | Kiehl |
| 8,432,762 B2 | 4/2013 | Kim |

(Continued)

FOREIGN PATENT DOCUMENTS

| CN | 102881318 A | 1/2013 |
| CN | 101770802 B | 4/2013 |

(Continued)

OTHER PUBLICATIONS

International Search Report in the international application No. PCT/CN2021/079898, dated Jun. 21, 2021.

(Continued)

*Primary Examiner* — Hien N Nguyen
(74) *Attorney, Agent, or Firm* — Syncoda LLC; Feng Ma

(57) ABSTRACT

A sense amplifier includes a first switch unit, a second switch unit, and an amplifier-latch module. A first port of the amplifier-latch module is electrically connected, via the first switch unit, to a bit line connected with a storage unit, and a second port of the amplifier-latch module is electrically connected to a reference voltage signal via the second switch unit. The amplifier-latch module is configured to amplify a signal in a sensing amplification phase. The first switch unit is configured to transmit a voltage on the bit line to the first port before the sensing amplification phase. The second switch unit is configured to transmit the reference voltage signal to the second port before the sensing amplification phase, and disconnect an electrical connection between the reference voltage signal and the second port in the sensing amplification phase.

20 Claims, 12 Drawing Sheets

(58) Field of Classification Search
CPC ... G11C 7/18; G11C 11/4097; G11C 11/4099; G11C 2207/002; G11C 2207/005; G11C 7/08; G11C 7/062; G11C 16/28
See application file for complete search history.

(56) References Cited

U.S. PATENT DOCUMENTS

| | | | |
|---|---|---|---|
| 2011/0080796 A1* | 4/2011 | Bruennert | G11C 11/4091 |
| | | | 365/205 |
| 2011/0205822 A1* | 8/2011 | Kim | G11C 11/4091 |
| | | | 365/207 |
| 2016/0093350 A1* | 3/2016 | Jung | G11C 11/1653 |
| | | | 365/158 |
| 2017/0365308 A1* | 12/2017 | Cha | G11C 7/22 |
| 2018/0233183 A1 | 8/2018 | Cha et al. | |
| 2019/0189192 A1* | 6/2019 | Kim | G11C 11/565 |

FOREIGN PATENT DOCUMENTS

| | | |
|---|---|---|
| CN | 106205689 B | 8/2019 |
| CN | 210156119 U | 3/2020 |
| CN | 210575115 U | 5/2020 |
| CN | 212303080 U | 1/2021 |
| JP | H0198187 A | 4/1989 |

OTHER PUBLICATIONS

Supplementary European Search Report in the European application No. 21834364.8, dated Nov. 28, 2022.

\* cited by examiner

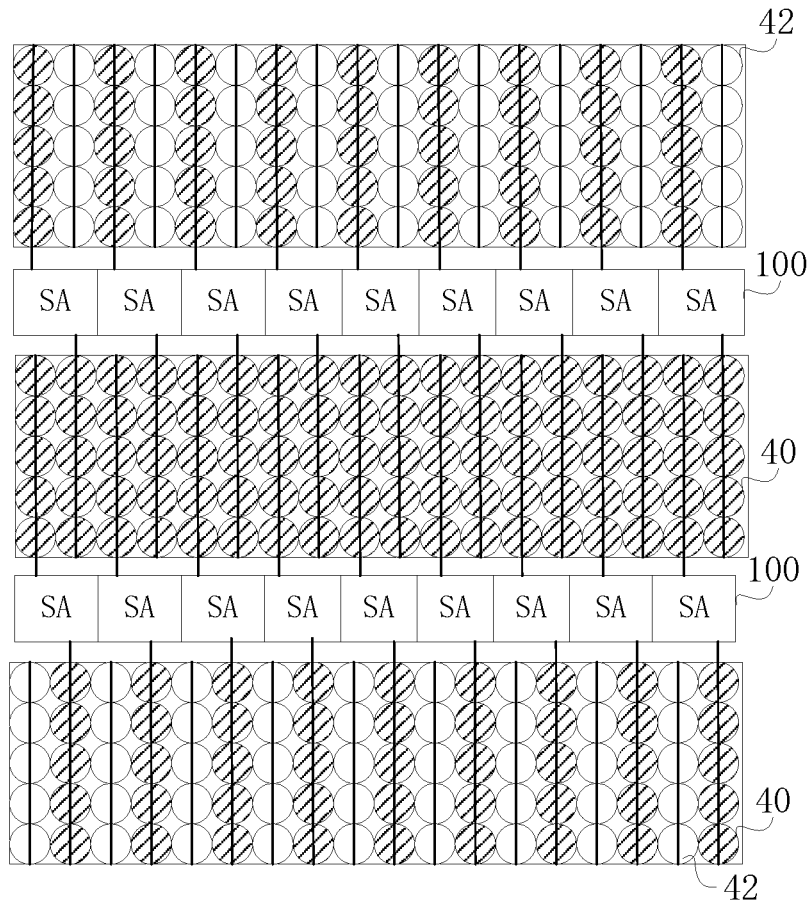

A first switch unit is controlled to transmit a voltage on a bit line to a first port of an amplification latch module before a sensing amplification phase, the first port being electrically connected, via the first switch unit, to the bit line connected with a storage unit

204

A second switch unit is controlled to transmit a reference voltage signal to a second port of the amplification latch module before the sensing amplification phase, and to disconnect an electrical connection between the reference voltage signal and the second port in the sensing amplification phase, the second port being electrically connected to the reference voltage signal via the second switch unit

FIG. 13

SENSE AMPLIFIER, STORAGE DEVICE AND READ-WRITE METHOD

CROSS-REFERENCE TO RELATED APPLICATIONS

The present application is a continuation of International Application No. PCT/CN2021/079898 filed on Mar. 10, 2021, which claims priority to Chinese Patent Application No. 202010615819.4 filed on Jun. 30, 2020. The disclosures of these applications are hereby incorporated by reference in their entireties.

BACKGROUND

A semiconductor storage device is typically set as a large two-dimensional array composed of storage units. The storage unit of each row may be selected by a row line (also typically referred to as a word line) and the storage unit of each column may be selected by a column line (also typically referred to as a bit line). The storage unit at an intersection of the word line and the bit line is configured to store corresponding information.

A sense amplifier can accurately determine the information stored in the storage unit, and is widely applied to various storage devices and configured to read the information stored in the storage unit.

SUMMARY

The disclosure relates to a sense amplifier, a storage device, and a read-write method.

According embodiments, a first aspect of the disclosure provides a sense amplifier, including a first switch unit, a second switch unit, and an amplifier-latch module. A first port of the amplifier-latch module is electrically connected, via the first switch unit, to a bit line connected with a storage unit, and a second port of the amplifier-latch module is electrically connected to a reference voltage signal via the second switch unit. The amplifier-latch module is configured to amplify a signal in a sensing amplification phase. The first switch unit is configured to transmit a voltage on the bit line to the first port before the sensing amplification phase. The second switch unit is configured to transmit the reference voltage signal to the second port before the sensing amplification phase, and to disconnect an electrical connection between the reference voltage signal and the second port in the sensing amplification phase.

A second aspect of the disclosure provides a storage device. The device includes a storage array, a plurality of bit lines, and a plurality of sense amplifiers as described in any one of the embodiments of the disclosure. The storage array comprising a plurality of storage units arranged in a plurality of rows and a plurality of columns. The bit lines are respectively electrically connected with the storage units located in the same column. Each sense amplifier is in one-to-one connection with each bit line.

A third aspect of the disclosure provides a read-write method, including the following operations.

A first switch unit is controlled to transmit a voltage on a bit line to a first port of an amplifier-latch module before a sensing amplification phase. The first port is electrically connected, via the first switch unit, to the bit line connected to a storage unit.

A second switch unit is controlled to transmit a reference voltage signal to a second port of the amplifier-latch module before the sensing amplification phase, and disconnect an electrical connection between the reference voltage signal and the second port in the sensing amplification phase. The second port is electrically connected to the reference voltage signal via the second switch unit. The details of one or more embodiments of the disclosure are set forth in the accompanying drawings and description below. Other features and advantages of the disclosure will be apparent from the specification, drawings, and claims.

BRIEF DESCRIPTION OF THE DRAWINGS

Apparently, the drawings in the following description are only some embodiments of the disclosure. Those of ordinary skill in the art may further obtain other drawings according to these drawings without creative work.

FIG. 12B is a structural schematic diagram of a conventional storage device.

FIG. 13 is a flow chart of a read-write method provided in a sixteenth embodiment of the disclosure.

Figure 1:
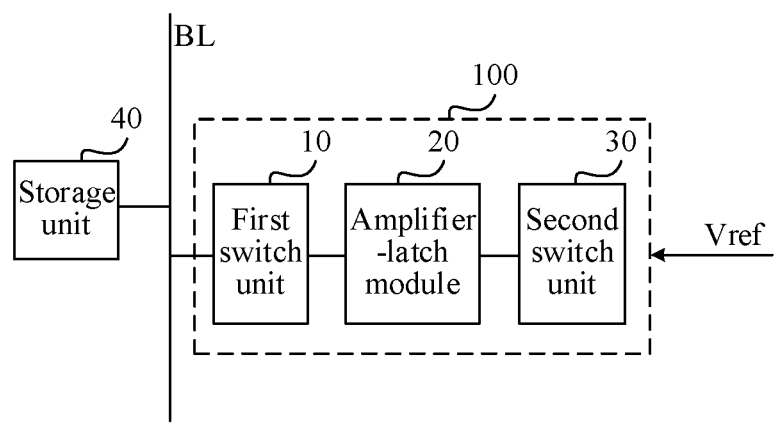
FIG. 1 is a structural diagram of a sense amplifier provided in an embodiment of the disclosure.

Reference numerals are illustrated as follows.

10, first switch unit; 20, amplifier-latch module; 21, first transistor; 22, second transistor; 23, third transistor; 24, fourth transistor; 25, third switch unit; 26: fourth switch unit; 27, precharging module; 30, second switch unit; 40, storage unit; 50, fifth switch unit; 51, first sub-switch unit; 52, second sub-switch unit; 60, sixth switch unit; 61, third sub-switch unit; 62, fourth sub-switch unit; 41 complementary storage unit; 42, float storage unit; 100, sense amplifier.

DETAILED DESCRIPTION

A sense amplifier in a conventional storage device needs to be further improved in terms of power consumption, speed, and utilization efficiency of a storage array.

To facilitate understanding of the disclosure, the disclosure will be described below in detail with reference to the accompanying drawings. Preferred embodiments of the disclosure are illustrated in the accompanying drawings. However, the disclosure may be embodied in many different forms and should not be construed as limited to the embodiments set forth herein. Rather, these embodiments are provided so that the disclosure will be thorough and complete.

Unless defined otherwise, all technical and scientific terms used herein have the same meaning as commonly understood by those of ordinary skill in the art to which the disclosure belongs. The terms used herein in the specification of the disclosure are for the purpose of describing specific embodiments only and are not intended to be limiting of the disclosure. Additionally, certain terms used throughout the specification and the following claims refer to specific elements. Those skilled in the art will appreciate that manufacturers may refer to elements with different names. The disclosure is not intended to distinguish elements that differ in name but identical in function. In the following description and embodiments, the terms "including" and "comprising" are used in an open style, and thus should be interpreted to mean "including, but not limited to . . . ". Likewise, the term "connected" is intended to mean an indirect or direct electrical connection. Accordingly, if one apparatus is connected to another apparatus, the connection may be made through the direct electrical connection, or through the indirect electrical connection of the other apparatus and a connector.

It is to be understood that, although the terms "first", "second", and the like may be used herein to describe various elements, these elements may not be limited by these terms. These terms are only adopted to distinguish an element from another element. For example, without departing from the scope of the disclosure, a first element may be called a second element, and similarly, the second element may be called the first element.

As shown in FIG. 1, a sense amplifier 100 provided in one embodiment of the disclosure includes a first switch unit 10, an amplifier-latch module 20, and a second switch unit 30. A first port of the amplifier-latch module 20 is electrically connected, via the first switch unit 10, to a Bit Line (BL) connected with a storage unit 40. A second port of the amplifier-latch module 20 is electrically connected to a reference voltage signal Vref via the second switch unit 30. The amplifier-latch module 20 is configured to amplify a signal in a sensing amplification phase. The first switch unit 10 is configured to transmit a voltage on the Bit Line (BL) to the first port of the amplifier-latch module 20 before the sensing amplification phase. The second switch unit 30 is configured to transmit the reference voltage signal Vref to the second port of the amplifier-latch module 20 before the sensing amplification phase, and to disconnect an electrical connection between the reference voltage signal Vref and the second port of the amplifier-latch module 20 in the sensing amplification phase.

In the sense amplifier in the above embodiment, it is realized that the amplifier-latch module 20 may perform an information read-write operation on the storage unit 40 connected with one bit line via the bit line. Compared with the amplifier-latch module in a conventional sense amplifier, in which one bit line is required to serve as a reference so as to avoid the situation of a chip area waste due to the fact that part of storage units in the storage unit array cannot be normally read and written, the sense amplifier has the advantage that the storage capacity of a storage chip in unit area may be remarkably improved. In addition, since the sense amplifier in the embodiment may perform the information read-write operation on the storage unit through the bit line connected with the sense amplifier without power consumption of a reference bit line, the energy consumption of the sense amplifier is reduced on the premise of ensuring that the sense amplifier has relatively high read-write speed.

Further, in a sense amplifier provided in one embodiment of the disclosure, with continued reference to FIG. 1, the first switch unit 10 is further configured to disconnect the electrical connection between the Bit Line (BL) and the first port of the amplifier-latch module 20 in the sensing amplification phase, and to turn on in a write recovery phase to write back data amplified by the amplifier-latch module 20 into the storage unit 40. The second switch unit 30 is further configured to disconnect the electrical connection between the second port of the amplifier-latch module 20 and the reference voltage signal Vref in the write recovery phase. Since the first switch unit 10 disconnects the connection between the amplifier-latch module 20 and the Bit Line (BL) in the sensing amplification phase, the influence of bit line parasitic capacitance on the signal sensing amplification speed of the amplifier-latch module 20 in the sensing amplification phase is avoided. Since the second switch unit 30 disconnects the electrical connection between the amplifier-latch module 20 and the reference voltage signal Vref in the write recovery phase, the energy consumption of the amplifier-latch module may be reduced, and the amplifier-latch module 20 is not influenced by the reference voltage signal Vref.

Figure 2:
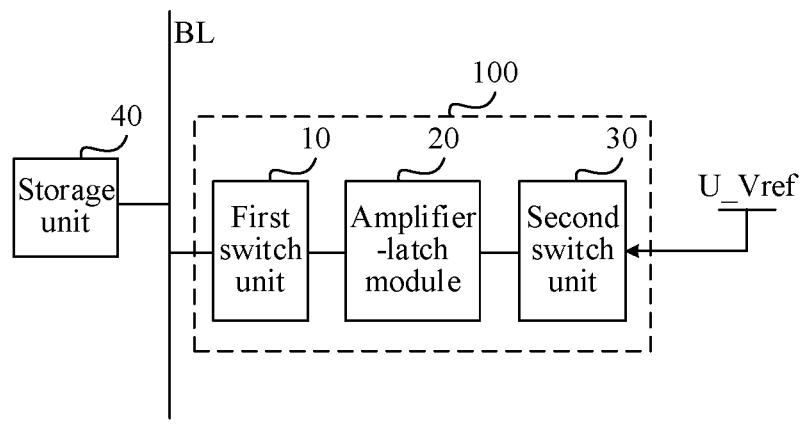
FIG. 2 is a structural diagram of a sense amplifier provided in a second embodiment of the disclosure.

Further, in a sense amplifier provided in one embodiment of the disclosure, as shown in FIG. 2, the second port of the amplifier-latch module 20 is electrically connected to a reference voltage source U_Vref via the second switch unit 30, and the reference voltage source U_Vref is configured to provide the reference voltage signal for the amplifier-latch module 20, so that the sense amplifier 100 may perform the information read-write operation on the storage unit 40 through a connected bit line without power consumption of the reference bit line, more energy is saved, and the storage capacity of the storage chip in unit area is remarkably improved.

Figure 3:
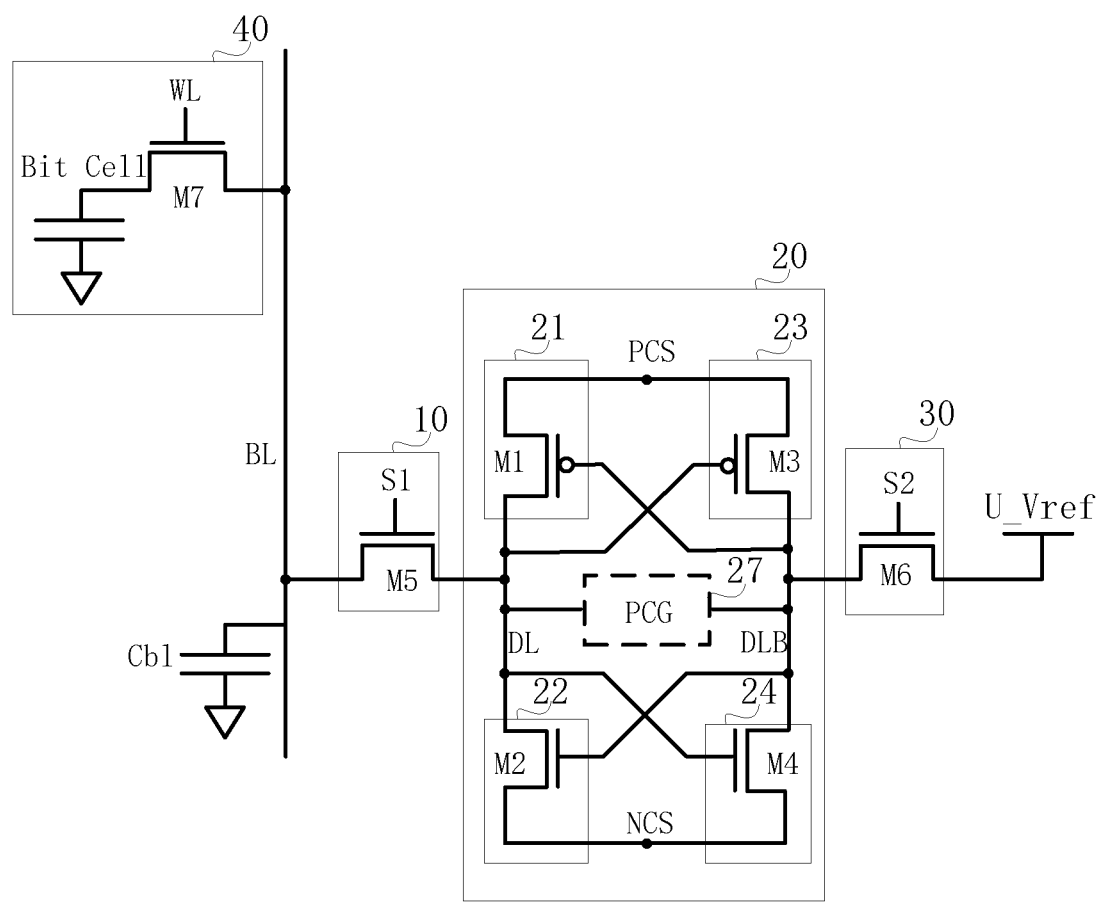
FIG. 3 is a schematic circuit diagram of a sense amplifier provided in a third embodiment of the disclosure.

Further, in a sense amplifier provided in one embodiment of the disclosure, as shown in FIG. 3, the amplifier-latch module 20 includes a first transistor 21, a second transistor 22, a third transistor 23, and a fourth transistor 24. A source of the first transistor 21 and a source of the third transistor 23 are electrically connected to a first voltage node PCS. A source of the second transistor 22 and a source of the fourth transistor 24 are electrically connected to a second voltage node NCS. A drain of the first transistor 21 and a drain of the second transistor 22 are electrically connected and serve as the first port of the amplifier-latch module 20. A drain of the third transistor 23 and a drain of the fourth transistor 24 are electrically connected and serve as the second port of the amplifier-latch module 20. A gate of the first transistor 21 and a gate of the second transistor 22 are electrically connected to the second port of the amplifier-latch module 20. A gate of the third transistor 23 and a gate of the fourth transistor 24 are electrically connected to the first port of the amplifier-latch module 20. In the embodiment, the first voltage node PCS may be set to an input high level signal, and the second voltage node NCS may be set to an input low level signal.

In the sense amplifier in the above embodiment, the first transistor and the second transistor connected in series are set to form a first inverter, and the third transistor and the fourth transistor connected in series are set to form a second inverter, so that the first inverter and the second inverter interact to form a latch. The latch may amplify and latch information read via the bit line, and may write the amplified and latched information into the storage unit via the bit line.

Further, with continued reference to FIG. 3, the first transistor 21 may be a PMOS transistor M1, the second transistor 22 may be an NMOS transistor M2, the third transistor 23 may be a PMOS transistor M3, and the fourth transistor 24 may be an NMOS transistor M4.

Figure 4:
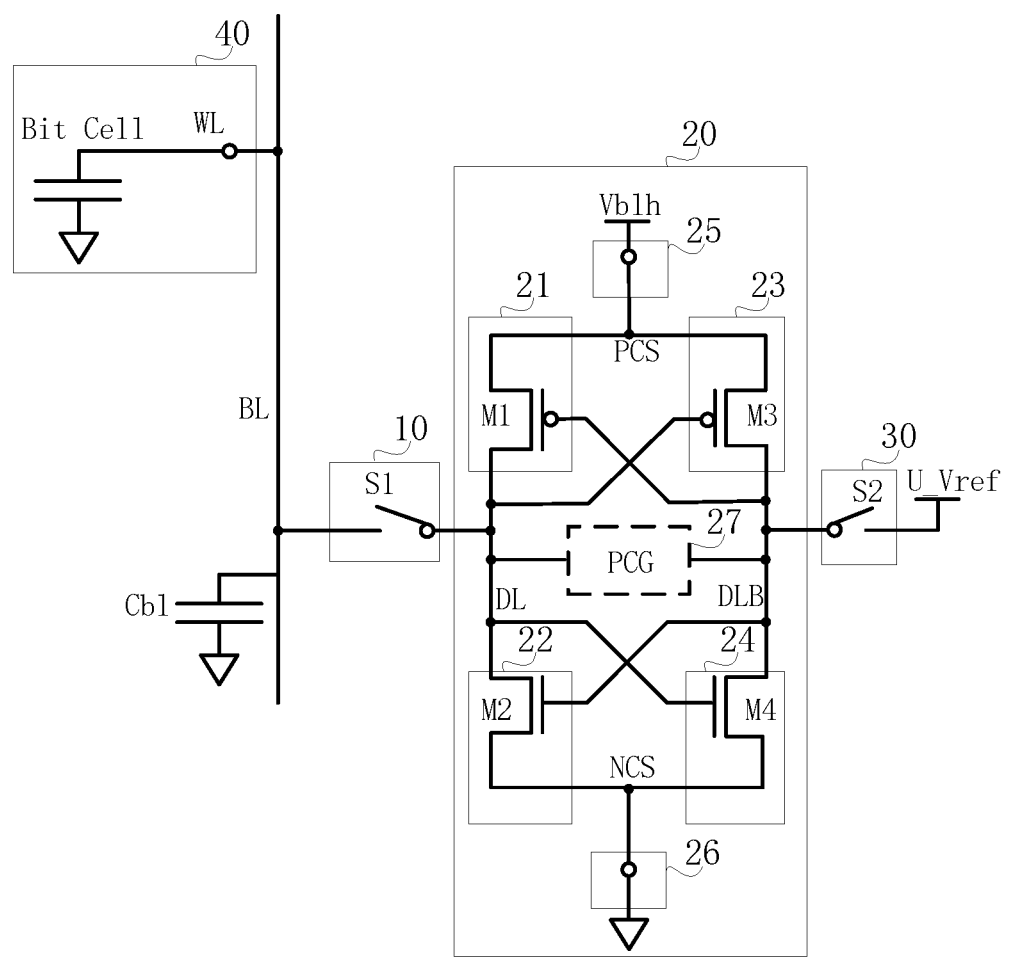
FIG. 4 is a schematic circuit diagram of a sense amplifier provided in a fourth embodiment of the disclosure.

Further, a sense amplifier provided in one embodiment of the disclosure, as shown in FIG. 4, further includes a third switch unit 25 and a fourth switch unit 26. The first voltage node PCS is connected to a power supply Vblh via the third switch unit 25. The third switch unit 25 is in a turn-on state in the sensing amplification phase and the write recovery phase, and is in a turn-off state in a precharging phase and a charge sharing phase. The second voltage node NCS is grounded via the fourth switch unit 26. The fourth switch unit 26 is in a turn-on state in the sensing amplification phase and the write recovery phase, and is in a turn-off state in the precharging phase and the charge sharing phase.

In the sense amplifier in the above embodiment, the third switch unit and the fourth switch unit are controlled to act to control the power supply situation of the amplifier-latch module, and in cooperation with the power demand situation of the sense amplifier in the four working phases, cooperatively act with the first transistor, the second transistor, the third transistor, and the fourth transistor, so that the amplifier-latch module may amplify and latch the information read via a single bit line, and the amplified and latched information may be written back into the storage unit via the bit line.

Further, with continued reference to FIG. 4, the sense amplifier further includes a precharging module 27. The precharging module 27 is connected between the first port of the amplifier-latch module 20 and the second port of the amplifier-latch module 20. The precharging module 27 is configured to precharge the first port of the amplifier-latch module 20 and the second port of the amplifier-latch module 20 in the precharging phase.

Figure 5:
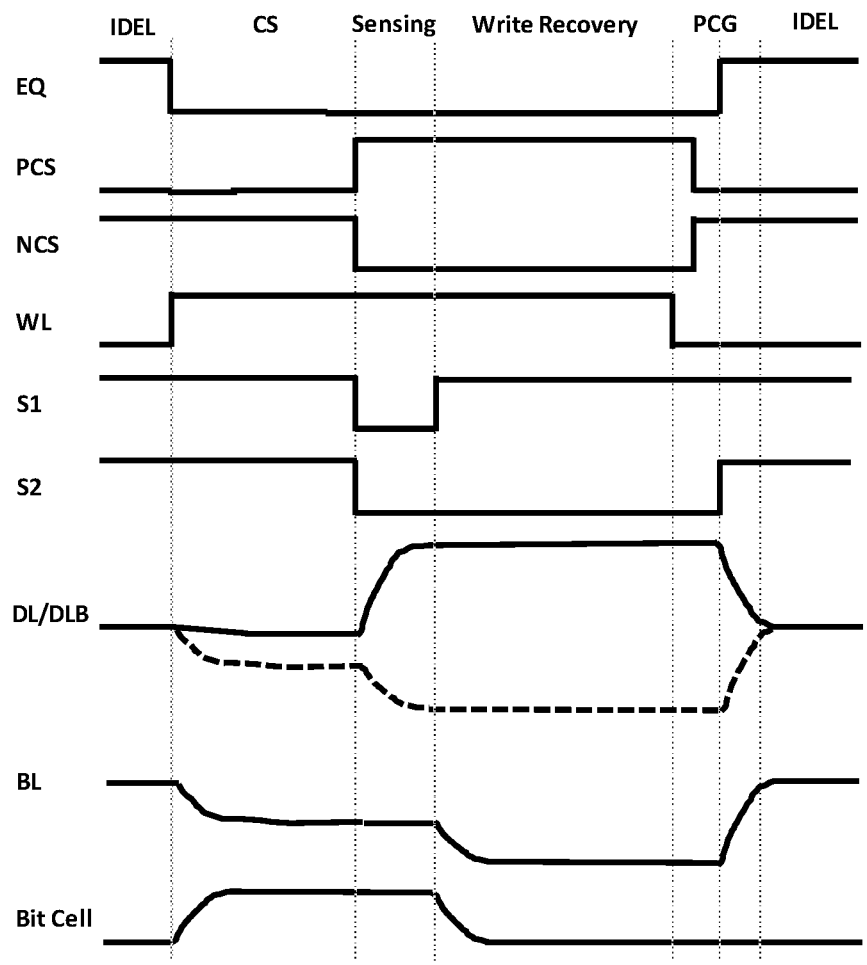
FIG. 5 is a schematic working sequence diagram of a sense amplifier illustrated in FIG. 4.

Specifically, referring to FIG. 4 and FIG. 5, a working state of the sense amplifier mainly includes four phases: a precharging phase PCG, a charge sharing phase CS, a sensing amplification phase Sensing, and a write recovery phase Write Recovery for writing the information to the storage unit. IDEL is a transition phase. A working principle of the sense amplifier in the embodiment is illustrated below in combination with the description of the working state of each element in the four phases.

In the precharging phase PCG, the first switch unit 10 and the second switch unit 30 are both in a closed turn-on state, the precharging module PCG starts to charge, a Word Line (WL) of the storage unit 40 is low, and the PCS and NCS are U_Vref.

In the charge sharing phase CS, the first switch unit 10 and the second switch unit 30 are both in the closed turn-on state, the Word Line (WL) of the storage unit 40 is high, the precharging module PCG stops charging, and the PCS and NCS are U_Vref.

In the sensing amplification phase Sensing, the first switch unit 10 and the second switch unit 30 are both in a turn-off state, the Word Line (WL) of the storage unit 40 is high, the third switch unit 25 and the fourth switch unit 26 are in the closed turn-on state, the PCS is Vblh, the NCS is in a low level, the precharging module PCG stops charging, and the amplifier-latch module 20 reads information from the storage unit 40 via the first switch unit 10.

In the write recovery phase Write Recovery, the first switch unit 10 is in the closed turn-on state, the second switch unit 30 is in the turn-off state, the Word Line (WL) of the storage unit 40 is high, the third switch unit 25 and the fourth switch unit 26 are both in the closed turn-on state, the PCS is at a high level, the NCS is in a low level, the precharging module PCG stops charging, and the amplifier-latch module 20 writes read information into the storage unit 40 via the first switch unit 10.

The sense amplifier sequentially circularly works in the four phases, and the information read-write operation is performed on the storage unit via the single bit line, so that the energy is saved, and the storage capacity of the storage chip in unit area is remarkably improved.

Figure 6:
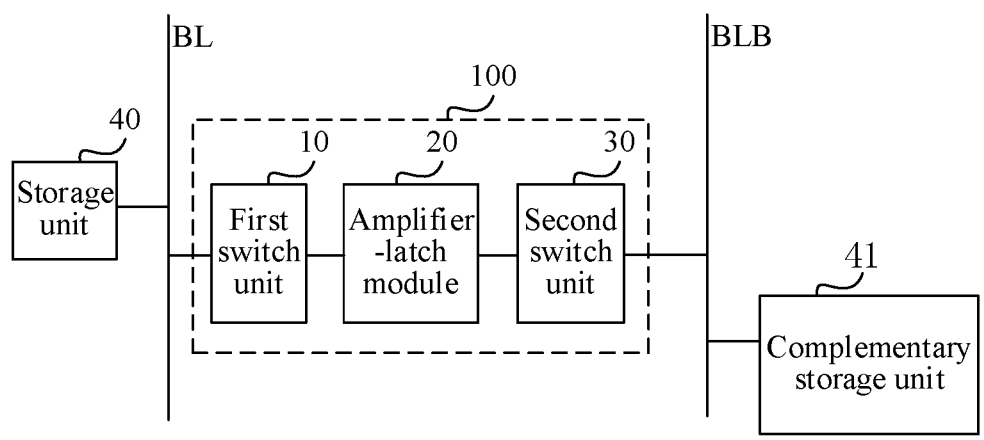
FIG. 6 is a structural diagram of a sense amplifier provided in a fifth embodiment of the disclosure.

Further, in a sense amplifier provided in one embodiment of the disclosure, as shown in FIG. 6, the first port of the second switch unit 30 is connected to the second port of the amplifier-latch module 20, and the second port of the second switch unit 30 is connected to a complementary bit line connected with a complementary storage unit 41. The complementary bit line is configured to provide the reference voltage signal for the amplifier-latch module 20. The complementary storage unit 41 and the storage unit 40 may be the same or different in structure. In the embodiment, it is preferable to set that the complementary storage unit 41 and the storage unit 40 are the same in structure.

Figure 7:
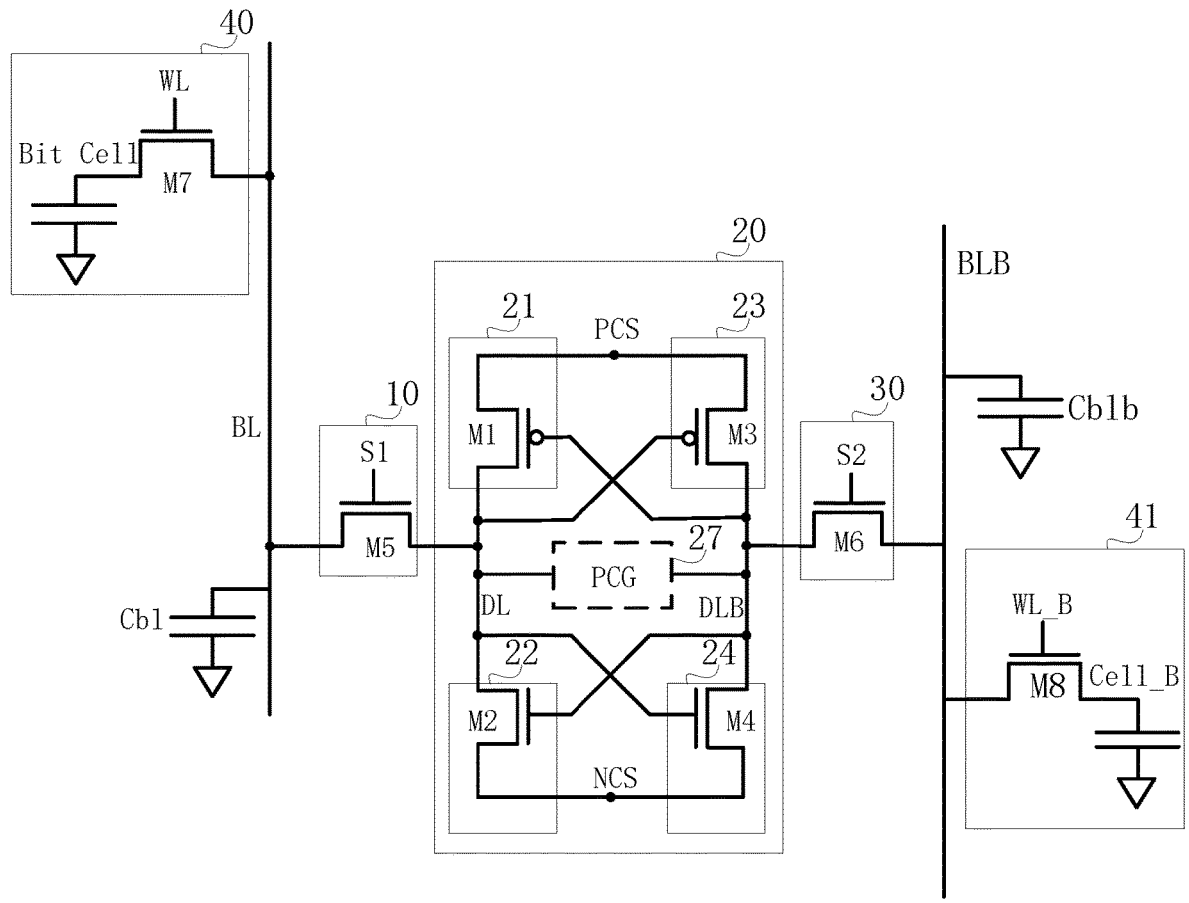
FIG. 7 is a schematic circuit diagram of a sense amplifier provided in a sixth embodiment of the disclosure.

Referring to FIG. 7, in a sense amplifier provided in one embodiment of the disclosure, the amplifier-latch module 20 is connected to the complementary bit line via the second switch unit 30, and the complementary bit line is connected to the complementary storage unit 41. The difference between the sense amplifier in the embodiment and the sense amplifier illustrated in FIG. 3 is that the power supply U_Vref illustrated in FIG. 3 is replaced by the complementary bit line. In the embodiment, the reference voltage signal is provided by the complementary bit line for the amplifier-latch module 20, and the working principle of the sense amplifier is the same as that of the sense amplifier illustrated in FIG. 3. Since in the sensing amplification phase and the write recovery phase, the amplifier-latch module is isolated from the complementary bit line by the second switch unit 30 in the turn-off state, the effect of reducing the power consumption is achieved. When the information in the complementary storage unit 41 connected with the complementary bit line is read, in the sensing amplification phase and the write recovery phase, the amplifier-latch module 20 is isolated from the Bit Line (BL) by the first switch unit 10 in the turn-off state. Whether to read the information of the storage unit 40 connected with the Bit Line (BL) or the information of the complementary storage unit 41 connected with the complementary bit line may be recognized by recognizing a word line (row) address signal, such as through recognition of whether the lowest bit of a word line (row) address is "1" or "0".

Further, in a sense amplifier provided in one embodiment of the disclosure, the sense amplifier further includes: a fifth switch unit and/or a sixth switch unit.

The first port of the fifth switch unit is connected to the second port of the amplifier-latch module, and the second port of the fifth switch unit is configured to output first information in the sensing amplification phase or after the sensing amplification phase.

The first port of the sixth switch unit is connected to the first port of the amplifier-latch module, and the second port of the sixth switch unit is configured to output second information in the sensing amplification phase or after the sensing amplification phase.

Figure 8A:
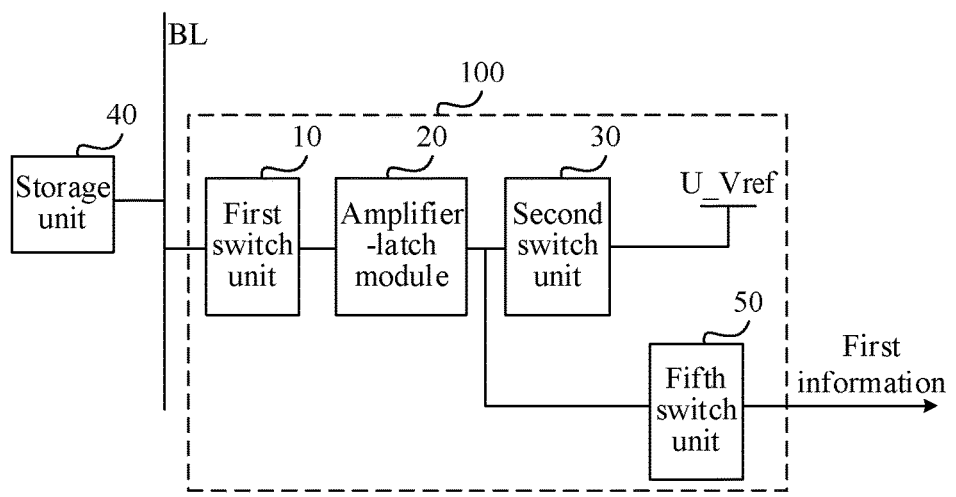
FIG. 8A is a structural diagram of a sense amplifier provided in a seventh embodiment of the disclosure.

Further, in a sense amplifier provided in one embodiment of the disclosure, as shown in FIG. 8a, the sense amplifier 100 further includes the fifth switch unit 50. The first port of the fifth switch unit 50 is connected to the second port of the amplifier-latch module 20, and the second port of the fifth switch unit 50 is configured to output the first information in the sensing amplification phase or after the sensing amplification phase. The influence of a load on the amplifier-latch module 20 in a procedure of reading the information by the amplifier-latch module 20 from the storage unit 40 is reduced.

Figure 8B:
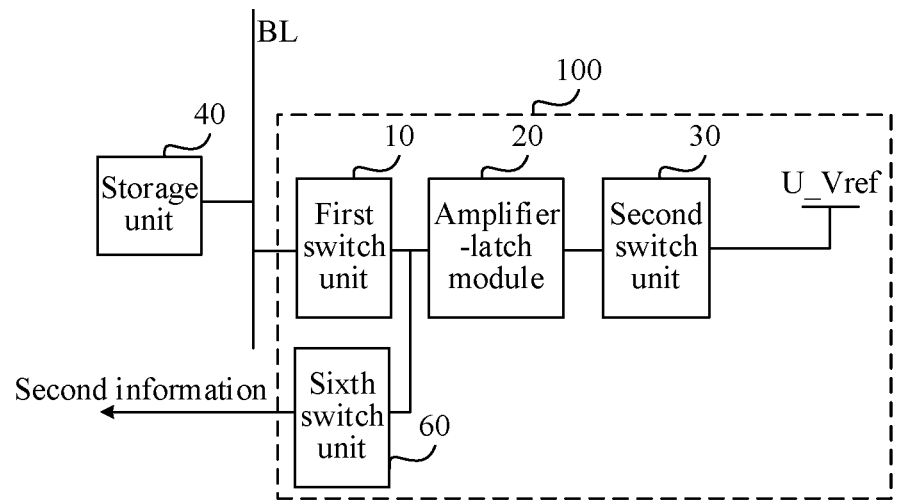
FIG. 8B is a structural diagram of a sense amplifier provided in an eighth embodiment of the disclosure.

Further, in a sense amplifier provided in one embodiment of the disclosure, as shown in FIG. 8b, the sense amplifier 100 further includes the sixth switch unit 60. The first port of the sixth switch unit 60 is connected to the first port of the amplifier-latch module 20, and the second port of the sixth switch unit 60 is configured to output the second information in the sensing amplification phase or after the sensing amplification phase.

Figure 8C:
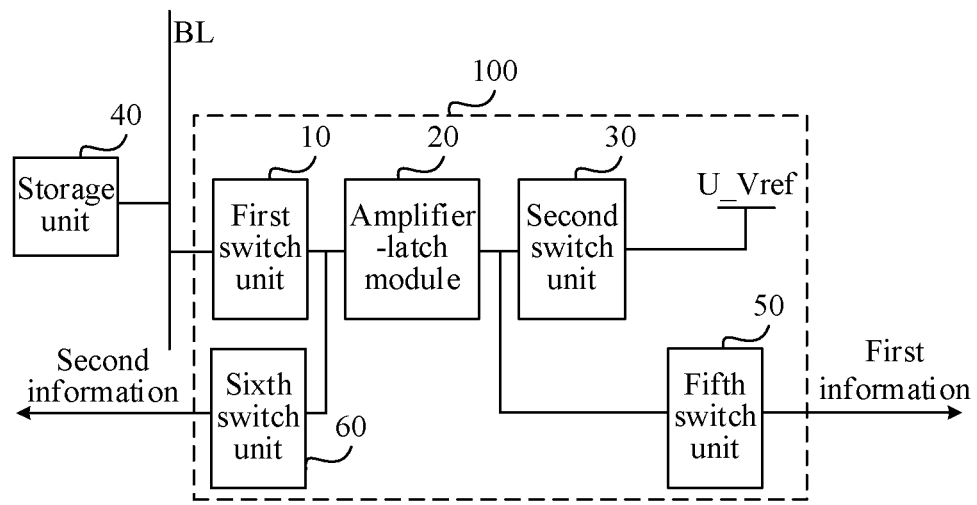
FIG. 8C is a structural diagram of a sense amplifier provided in a ninth embodiment of the disclosure.

Further, in a sense amplifier provided in one embodiment of the disclosure, as shown in FIG. 8c, the sense amplifier 100 further includes the fifth switch unit 50 and the sixth switch unit 60, the first port of the fifth switch unit 50 is connected to the second port of the amplifier-latch module 20, and the second port of the fifth switch unit 50 is configured to output the first information in the sensing amplification phase or after the sensing amplification phase. The first port of the sixth switch unit 60 is connected to the first port of the amplifier-latch module 20, and the second port of the sixth switch unit 60 is configured to output the second information in the sensing amplification phase or after the sensing amplification phase.

Figure 9:
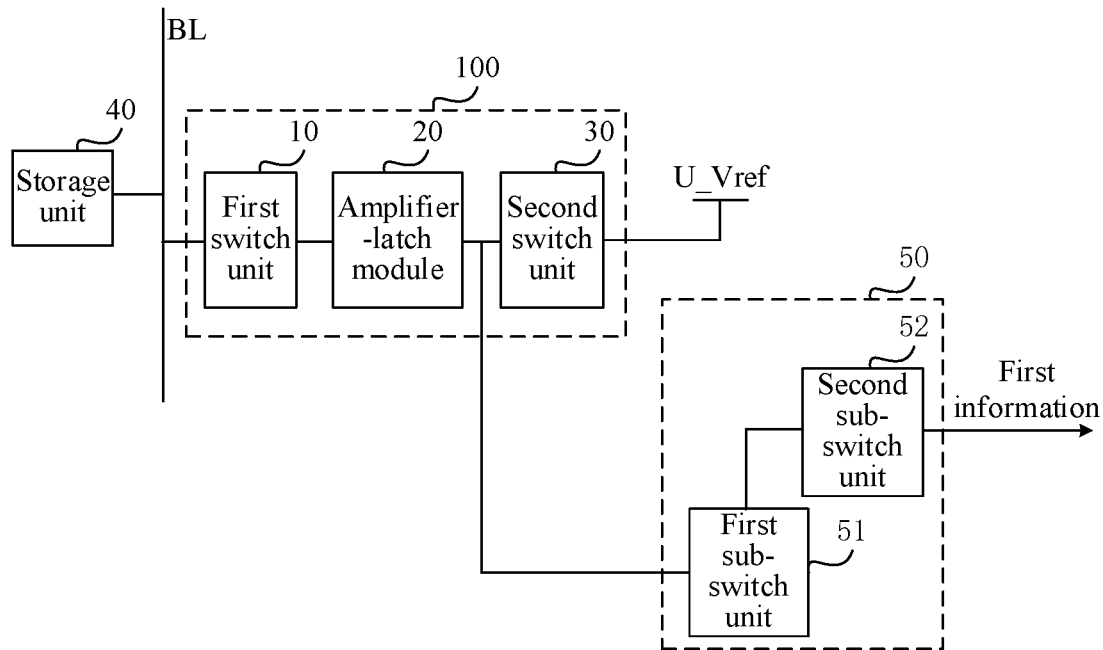
FIG. 9 is a structural diagram of a sense amplifier provided in a tenth embodiment of the disclosure.

Further, as shown in FIG. 9, in a sense amplifier provided in one embodiment of the disclosure, the fifth switch unit 50 includes a first sub-switch unit 51 and a second sub-switch unit 52 which are connected in series. The first sub-switch unit 51 is connected with the second port of the amplifier-latch module 20. In the sensing amplification phase or after the sensing amplification phase, the second sub-switch unit 52 outputs the first information read by the amplifier-latch module 20 from the storage unit 40.

Figure 10:
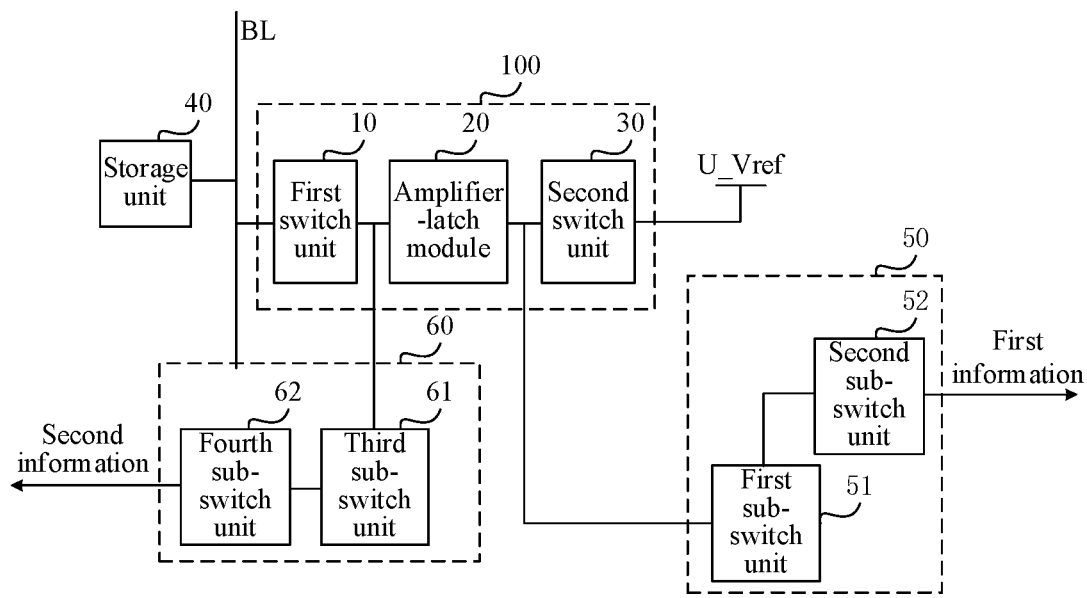
FIG. 10 is a structural diagram of a sense amplifier provided in an eleventh embodiment of the disclosure.

Further, in a sense amplifier provided in one embodiment of the disclosure, as shown in FIG. 10, the difference between the embodiment and the embodiment shown in FIG. 9 is that the embodiment further includes the sixth switch unit 60. The first port of the sixth switch unit 60 is connected to the first port of the amplifier-latch module 20, and the second port of the sixth switch unit 60 is configured to output the second information in the sensing amplification phase or after the sensing amplification phase. In the embodiment, the sixth switch unit 60 includes a third sub-switch unit 61 and a fourth sub-switch unit 62 which are connected in series. The third sub-switch unit 61 is connected to the first port of the amplifier-latch module 20. In the sensing amplification phase or after the sensing amplification phase, the fourth sub-switch unit 62 outputs the second information read by the amplifier-latch module 20 from the storage unit 40.

Figure 11A:
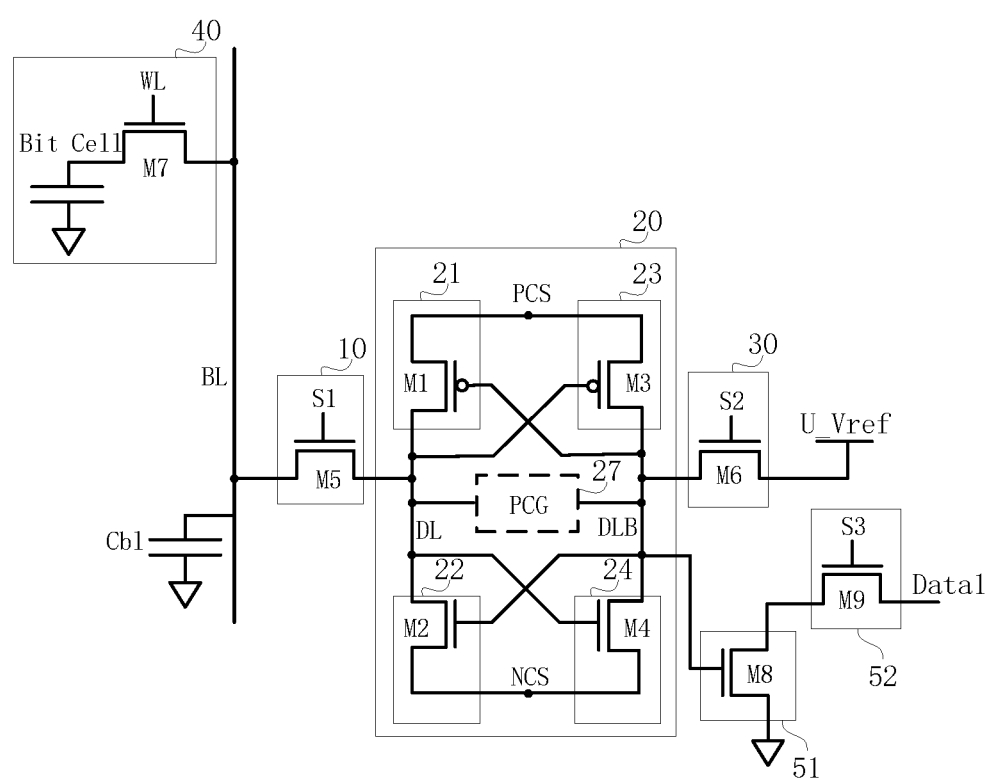
FIG. 11A is a schematic circuit diagram of a sense amplifier provided in a twelfth embodiment of the disclosure.

Further, referring to FIG. 11a, the first sub-switch unit 51 includes an NMOS transistor M8, and the second sub-switch unit 52 includes an NMOS transistor M9. A source terminal of the NMOS transistor M8 is grounded, a gate terminal of the NMOS transistor M8 is connected to the second port of the amplifier-latch module 20, and the source terminal of the NMOS transistor M9 is connected to a drain terminal of the NMOS transistor M8. The drain terminal of the NMOS transistor M9 is configured to output the first information Data1 read by the amplifier-latch module from the storage unit 40. The NMOS transistor M8 and the NMOS transistor M9 are in the closed turn-on state in the sensing amplification phase or after the sensing amplification phase, to output, via the drain terminal of the NMOS transistor M9, the first information Data1 read by the amplifier-latch module 20 from the storage unit 40.

Figure 11B:
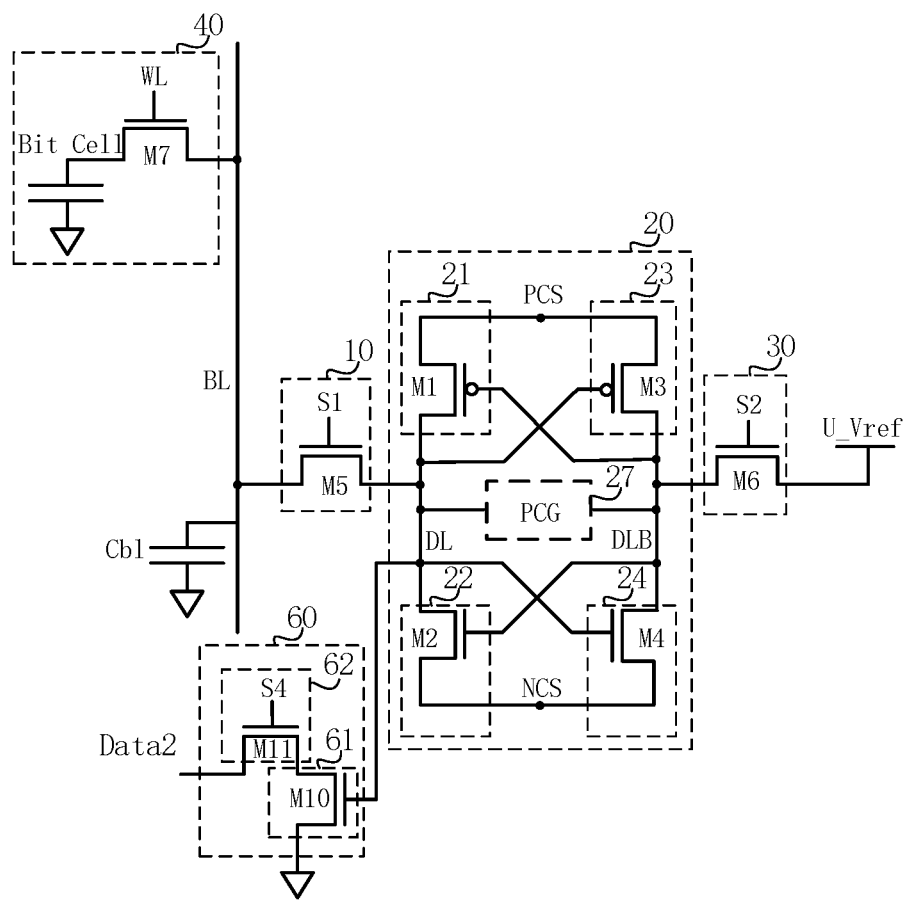
FIG. 11B is a schematic circuit diagram of a sense amplifier provided in a thirteenth embodiment of the disclosure.

Further, referring to FIG. 11b, the difference between the embodiment and the embodiment shown in FIG. 8b is that the sixth switch unit 60 includes the third sub-switch unit 61 and the fourth sub-switch unit 62 which are connected in series. The third sub-switch unit 61 is connected to the first port of the amplifier-latch module 20. In the sensing amplification phase or after the sensing amplification phase, the fourth sub-switch unit 62 outputs the second information read by the amplifier-latch module 20 from the storage unit 40. The third sub-switch unit 61 includes an NMOS transistor M10, and the fourth sub-switch unit 62 includes an NMOS transistor M11. The source terminal of the NMOS transistor M10 is grounded, the gate terminal of the NMOS transistor M10 is connected to the first port of the amplifier-latch module 20, and the source terminal of the NMOS transistor M11 is connected to the drain terminal of the NMOS transistor M10. The drain terminal of the NMOS transistor M11 is configured to output the second information Data2 read by the amplifier-latch module 20 from the storage unit 40.

Figure 11C:
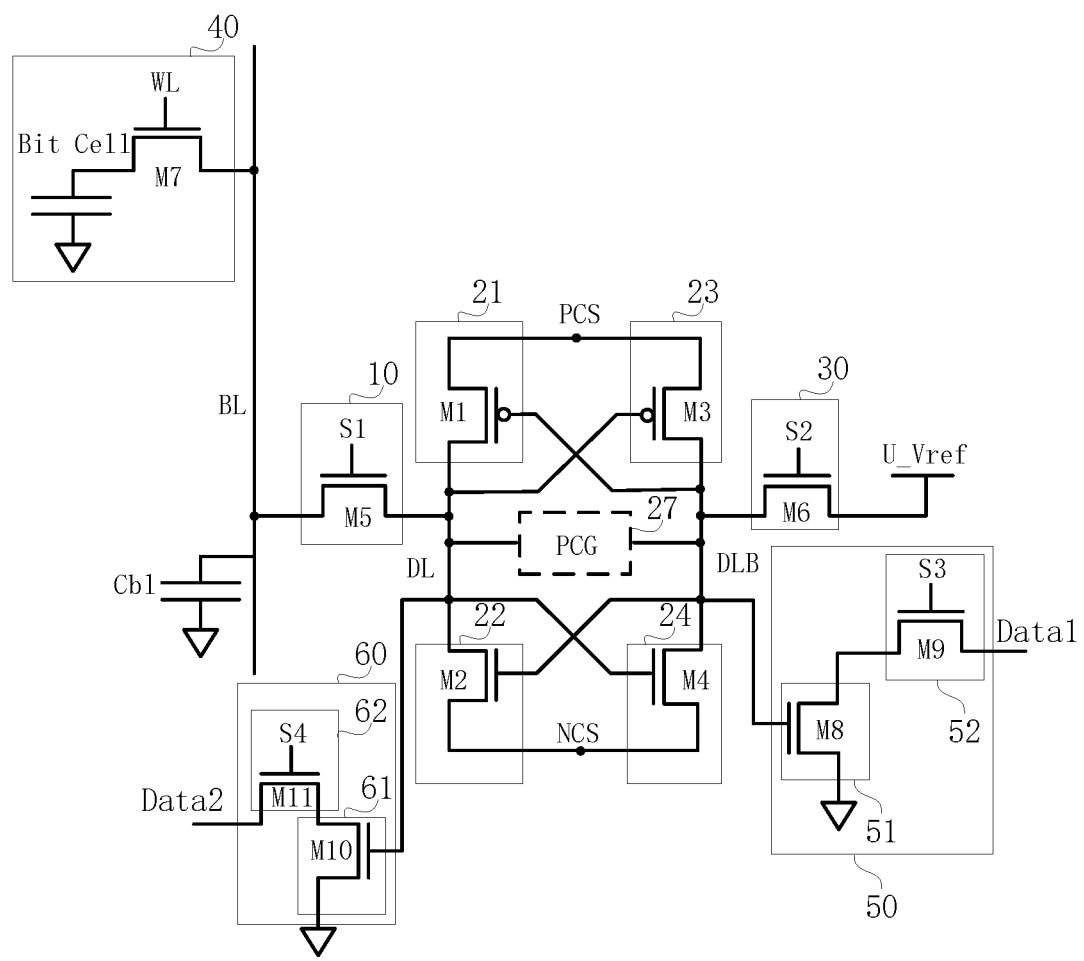
FIG. 11C is a schematic circuit diagram of a sense amplifier provided in a fourteenth embodiment of the disclosure.

Further, referring to FIG. 11c, the first sub-switch unit 51 includes the NMOS transistor M8, and the second sub-switch unit 52 includes the NMOS transistor M9. The source terminal of the NMOS transistor M8 is grounded, the gate terminal of the NMOS transistor M8 is connected to the second port of the amplifier-latch module 20, and the source terminal of the NMOS transistor M9 is connected to the drain terminal of the NMOS transistor M8. The drain terminal of the NMOS transistor M9 is configured to output the first information Data1 read by the amplifier-latch module 20 from the storage unit 40. The third sub-switch unit 61 includes the NMOS transistor M10, and the fourth sub-switch unit 62 includes the NMOS transistor M11. The source terminal of the NMOS transistor M10 is grounded, the gate terminal of the NMOS transistor M10 is connected to the first port of the amplifier-latch module 20, and the source terminal of the NMOS transistor M11 is connected to the drain terminal of the NMOS transistor M10. The drain terminal of the NMOS transistor M11 is configured to output the second information Data2 read by the amplifier-latch module 20 from the storage unit 40.

Specifically, with continued reference to FIG. 11c, a data output port of the second sub-switch unit and a data output port of the fourth sub-switch unit may both be precharged to a high level. If "0" stored in a storage unit 40 is read, the first port of the amplifier-latch module 20 is low and the second port is high in the sensing amplification phase or after the sensing amplification phase. The high level of the second port of the amplifier-latch module 20 enables the NMOS transistor M8 to be turned on, and a low level signal is output via the NMOS transistor M9. At the same time, the low level signal of the first port of the amplifier-latch module 20 enables the NMOS transistor M10 to be in a cut-off state, and enables the data output port of the NMOS transistor M11 to be maintained at a high level state at the time of precharging. Therefore, differential complementary transmission of a signal is realized, and the signal transmission accuracy is guaranteed.

Although a single transistor is shown in FIG. 11a, FIG. 11b and FIG. 11c, the first sub-switch unit 51 or the second sub-switch unit 52 may be a plurality of NMOS transistors arranged in parallel, and the third sub-switch unit 61 or the fourth sub-switch unit 62 may be a plurality of NMOS transistors arranged in parallel. In general, the use of the plurality of transistors in parallel may help to improve the current handling ability of the transistors. Since the signal of the first port and/or the second port of the amplifier-latch module 20 is connected to the gate of the NMOS transistor M8 or the NMOS transistor M10, the load does not influence the state of the amplifier-latch module 20 when a result is output, so that the accuracy of the stored data is not influenced. FIG. 11a, FIG. 11b and FIG. 11c are intended to schematically illustrate the working principle of the disclosure and are not taken as limitations to the disclosure. Equivalent variations of circuits shown in FIG. 11a, FIG. 11b and FIG. 11c may be made according to practical requirements, all falling within the scope of protection of the disclosure.

Further, in a sense amplifier provided in one embodiment of the disclosure, as shown in FIG. 11a, FIG. 11b and FIG. 11c, the storage unit 40 includes a storage capacitor Bit cell and a select transistor M7. A control terminal of the select transistor M7 is connected with the Word Line (WL). The select transistor M7 is connected between the storage capacitor Bit cell and the Bit Line (BL) in series. The select transistor M7 is configured to be in the turn-off state in the precharging phase and to be in the turn-on state in the charge share phase, the sensing amplification phase, and the write recovery phase. The select transistor M7 may be the NMOS transistor.

Figure 12A:
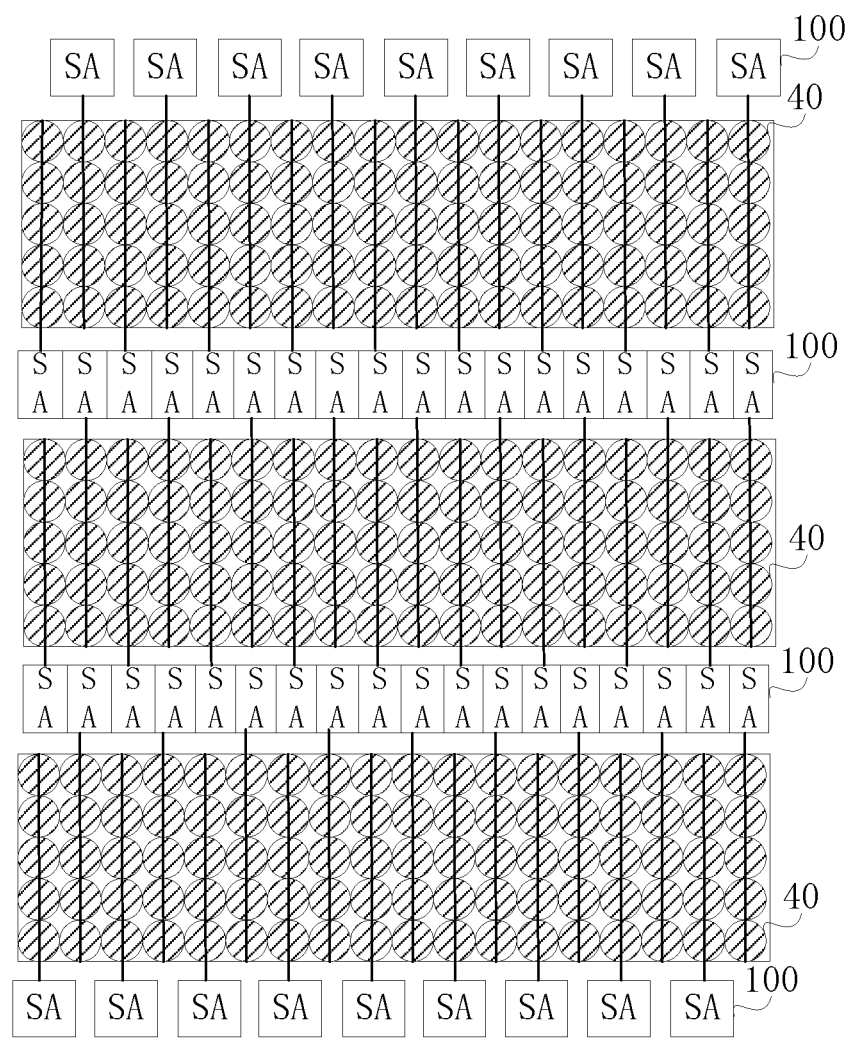
FIG. 12A is a structural schematic diagram of a storage device provided in a fifteenth embodiment of the disclosure.

A storage device provided in one embodiment of the disclosure, as shown in FIG. 12, includes a storage array, and a plurality of bit lines, the storage array including a plurality of storage units 40 arranged in a plurality of rows and a plurality of columns, and the bit lines being respectively electrically connected to the storage units 40 located in the same column; and a plurality of the sense amplifiers in any one of the embodiments of the disclosure, the sense amplifiers being in one-to-one connection with the bit lines. FIG. 12b shows the storage device formed by using a conventional sense amplifier. As can be seen from FIG. 12b, half of the storage units on an edge of the storage array of the storage device are float storage units 42 in an idle state, thereby resulting in a waste of storage chip area. Through the use of the sense amplifier in the embodiments of the disclosure, in the case that a complementary bit line for providing a reference voltage signal is not connected, an information read-write operation may be performed, via a single bit line, on the storage unit connected with the single bit line, so that the waste of the chip area due to the existence of the float storage unit in the storage device is avoided. The float storage unit 42 and the storage unit 40 may be the same or different in structure. In the embodiment, it is preferable to set that the float storage unit 42 and the storage unit 40 are the same in structure.

A read-write method provided in one embodiment of the disclosure, as shown in FIG. 13, includes the following steps.

At S202, a first switch unit is controlled to transmit a voltage on a bit line to a first port of an amplifier-latch module before a sensing amplification phase, the first port being electrically connected, via the first switch unit, to the bit line connected with a storage unit.

At S204, a second switch unit is controlled to transmit a reference voltage signal to a second port of the amplifier-latch module before the sensing amplification phase, and to disconnect an electrical connection between the reference voltage signal and the second port in the sensing amplification phase, the second port being electrically connected to the reference voltage signal via the second switch unit.

In the read-write method in the above-described embodiment, it is realized that the amplifier-latch module may perform the information read-write operation on the storage unit connected with one bit line via the bit line. Compared with the amplifier-latch module in a conventional read-write method, in which one bit line is required to serve as a reference so as to avoid the situation of chip area waste due to the fact that part of storage units in the storage unit array is not normally read and written, the sense amplifier has the advantage that the storage capacity of a storage chip in unit area may be remarkably improved, and the utilization efficiency of a storage unit array is improved. In addition, since the read-write method in the embodiment may perform the information read-write operation on the storage unit through a connected bit line without power consumption of a reference bit line, the energy consumption is reduced on the premise of ensuring the read-write speed.

For a specific definition of the read-write method in the above embodiments, reference is made to the above definition of the sense amplifier, which will not be described in detail herein.

It will be appreciated that although various steps in the flow charts of FIG. 13 are shown sequentially as indicated by the arrows, these steps are not necessarily performed sequentially as indicated by the arrows. Unless explicitly stated otherwise herein, the steps are not performed in a strict order of limitation, and the steps may be performed in other orders. Moreover, at least part of the steps of FIG. 13 may include a plurality of steps or phases that are not necessarily performed at the same time, but may be performed at different times. The steps or phases are not necessarily performed sequentially, but may be performed in turn or alternately with at least part of the other steps or the steps or phases of the other steps.

Those of ordinary skill in the art should understand that all or part of flows for implementing the method of the above embodiment may be completed by instructing related hardware through a computer program. The computer program may be stored in a nonvolatile computer-readable storage medium. When the computer program is executed, the flow of the embodiment of each method described above is included. Any reference to a memory, a storage, a database, or other media used in each embodiment provided by the disclosure may include a nonvolatile and/or volatile memory. This includes, but is not limited to, a DRAM, an SDRAM, an SRAM, a DDR SDRAM, a DDR2 SDRAM, a DDR3 SDRAM, a DDR4 SDRAM, an LPDDR4 SDRAM, a DDR5 SDRAM, an LPDDR5 SDRM, a GDDR5 SDRAM, a GDDR6 SDRAM, a PRAM, an MRAM, and a RRAM.

It is to be noted that the above embodiments are for illustrative purposes only and are not meant to limit the disclosure.

The various embodiments in the specification are described in an incremental manner, each embodiment is described with emphasis on the difference from the other embodiments, and the same or similar parts among the various embodiments refer to each other.

The various technical features of the above embodiments may be combined in any combination, and in order to simplify the description, all possible combinations of the various technical features of the above embodiments are not described, however, as long as the combinations of these technical features are not contradictory, they should be considered to be within the scope of the specification.

The above examples are merely illustrative of several embodiments of the disclosure, which are described in more detail and are not to be construed as limiting the scope of the patent of the disclosure.

What is claimed is:

1. A sense amplifier, comprising:
   a first switch unit;
   a second switch unit; and
   an amplifier-latch module, wherein a first port of the amplifier-latch module is electrically connected, via the first switch unit, to a bit line connected with a storage unit, and a second port of the amplifier-latch module is electrically connected to a reference voltage signal via the second switch unit,
   wherein the amplifier-latch module is configured to amplify a signal in a sensing amplification phase, the first switch unit is configured to transmit a voltage on the bit line to the first port before the sensing amplification phase, and the second switch unit is configured to transmit the reference voltage signal to the second port before the sensing amplification phase, and to disconnect an electrical connection between the reference voltage signal and the second port in the sensing amplification phase.

2. The sense amplifier of claim 1, wherein the first switch unit is further configured to disconnect an electrical connection between the bit line and the first port in the sensing amplification phase and to turn on in a write recovery phase to write back data amplified by the amplifier-latch module into the storage unit.

3. The sense amplifier of claim 2, wherein the second switch unit is further configured to disconnect an electrical connection between the second port and the reference voltage signal in the write recovery phase.

4. The sense amplifier of claim 1, wherein the second port of the amplifier-latch module is electrically connected to a reference voltage source via the second switch unit, the reference voltage source is configured to provide the reference voltage signal for the amplifier-latch module.

5. The sense amplifier of claim 1, wherein the second port of the amplifier-latch module is electrically connected, via the second switch unit, to a complementary bit line connected with a complementary storage unit, the complementary bit line is configured to provide the reference voltage signal for the amplifier-latch module.

6. The sense amplifier of claim 1, wherein the amplifier-latch module comprises a first transistor, a second transistor, a third transistor and a fourth transistor,
   wherein a source of the first transistor and a source of the third transistor are electrically connected to a first voltage node, a source of the second transistor and a source of the fourth transistor are electrically connected to a second voltage node, a drain of the first transistor and a drain of the second transistor are electrically connected and serve as the first port of the amplifier-latch module, a drain of the third transistor and a drain of the fourth transistor are electrically connected and serve as the second port of the amplifier-latch module, a gate of the first transistor and a gate of the second transistor are electrically connected to the second port, and a gate of the third transistor and a gate of the fourth transistor are electrically connected to the first port.

7. The sense amplifier of claim 6, further comprising:
   a third switch unit, wherein the first voltage node is connected to a power supply signal via the third switch unit, the third switch unit is in a turn-on state in the sensing amplification phase and the write recovery phase, and is in a turn-off state in a precharging phase and a charge sharing phase; and
   a fourth switch unit, wherein the second voltage node is grounded via the fourth switch unit, the fourth switch unit is in the turn-on state in the sensing amplification phase and the write recovery phase, and is in the turn-off state in the charge sharing phase and the precharging phase.

8. The sense amplifier of claim 7, wherein the first transistor and the third transistor are both PMOS transistors, and the second transistor and the fourth transistor are both NMOS transistors.

9. The sense amplifier of claim 1, further comprising:
   a precharging module, wherein the precharging module is connected between the first port of the amplifier-latch module and the second port of the amplifier-latch module, the precharging module is configured to precharge the first port and the second port of the amplifier-latch module in the precharging phase.

10. The sense amplifier of claim 1, further comprising:
    a fifth switch unit, wherein a first port of the fifth switch unit is connected to the second port of the amplifier-latch module, and a second port of the fifth switch unit is configured to output first information in the sensing amplification phase or after the sensing amplification phase.

11. The sense amplifier of claim 10, wherein the fifth switch unit comprises a first sub-switch unit and a second sub-switch unit which are connected in series,
    wherein the first sub-switch unit is connected to the second port of the amplifier-latch module; in the sensing amplification phase or after the sensing amplification phase, the second sub-switch unit outputs information read by the amplifier-latch module from the storage unit.

12. The sense amplifier of claim 11, further comprising:
    a sixth switch unit, wherein a first port of the sixth switch unit is connected to the first port of the amplifier-latch module, and a second port of the sixth switch unit is configured to output second information in the sensing amplification phase or after the sensing amplification phase.

13. The sense amplifier of claim 12, wherein the sixth switch unit comprises a third sub-switch unit and a fourth sub-switch unit which are connected in series, the third sub-switch unit is connected to the first port of the amplifier-latch module, and in the sensing amplification phase or after the sensing amplification phase, the fourth sub-switch unit outputs second information read by the amplifier-latch module from the storage unit.

14. The sense amplifier of claim 13, wherein a data output port of the second sub-switch unit and a data output port of the fourth sub-switch unit are both precharged to a high level.

15. The sense amplifier of claim 13, wherein the first sub-switch unit or the second sub-switch unit is a plurality of NMOS transistors arranged in parallel, and the third sub-switch unit or the fourth sub-switch unit is a plurality of NMOS transistors arranged in parallel.

16. The sense amplifier of claim 11, wherein the first sub-switch unit is an NMOS transistor, and
    the second sub-switch unit is an NMOS transistor.

17. The sense amplifier of claim 1, wherein the storage unit comprises:
    a storage capacitor; and
    a select transistor connected in series between the storage capacitor and the bit line, wherein the select transistor is configured to be in a turn-off state in the precharging phase, and to be in a turn-on state in the charge sharing phase, the sensing amplification phase and the write recovery phase.

18. The sense amplifier of claim 17, wherein the select transistor is an NMOS transistor.

19. A storage device, comprising:
a storage array, which comprises a plurality of storage units arranged in a plurality of rows and a plurality of columns;
a plurality of bit lines, wherein the bit lines are respectively electrically connected to the storage units located in a same column; and
a plurality of sense amplifiers of claim 1, wherein the sense amplifiers are in one-to-one connection with the bit lines.

20. A read-write method, comprising:
controlling a first switch unit to transmit a voltage on a bit line to a first port of an amplifier-latch module before a sensing amplification phase, wherein the first port is electrically connected, via the first switch unit, to the bit line connected to a storage unit; and
controlling a second switch unit to transmit a reference voltage signal to a second port of the amplifier-latch module before the sensing amplification phase, and disconnecting an electrical connection between the reference voltage signal and the second port in the sensing amplification phase, wherein the second port is electrically connected to the reference voltage signal via the second switch unit.

* * * * *